(12) United States Patent
Tsyrganovich

(10) Patent No.: US 6,839,010 B1
(45) Date of Patent: Jan. 4, 2005

(54) SIGMA-DELTA ANALOG-TO-DIGITAL CONVERTER WITH REDUCED QUANTIZATION NOISE

(75) Inventor: Anatoliy V. Tsyrganovich, San Jose, CA (US)

(73) Assignee: ZiLOG, Inc., San Jose, CA (US)

(*) Notice: Subject to any disclaimer, the term of this patent is extended or adjusted under 35 U.S.C. 154(b) by 25 days.

(21) Appl. No.: 10/331,037

(22) Filed: Dec. 27, 2002

(51) Int. Cl.[7] .............................................. H03M 3/00
(52) U.S. Cl. ........................ 341/143; 341/144; 341/155; 341/172
(58) Field of Search ............................. 341/143, 155, 341/172, 61, 156, 118, 120

(56) References Cited

U.S. PATENT DOCUMENTS

| | | | |
|---|---|---|---|
| 4,851,841 A | | 7/1989 | Sooch ........................ 341/143 |
| 5,157,395 A | * | 10/1992 | Del Signore et al. ....... 341/143 |
| 5,181,033 A | * | 1/1993 | Yassa et al. ................. 341/143 |
| 5,724,037 A | * | 3/1998 | Lee ............................. 341/143 |
| 5,781,138 A | * | 7/1998 | Knudsen .................... 341/143 |
| 6,009,445 A | | 12/1999 | Tsyrganovich ............. 708/300 |
| 6,147,633 A | * | 11/2000 | Ukawa et al. .............. 341/143 |
| 6,218,973 B1 | * | 4/2001 | Barrett et al. ............... 341/143 |
| 6,249,237 B1 | * | 6/2001 | Prater ......................... 341/143 |
| 6,252,531 B1 | * | 6/2001 | Gordon et al. .............. 341/143 |
| 6,304,608 B1 | * | 10/2001 | Chen et al. ................. 341/143 |
| 6,346,898 B1 | * | 2/2002 | Melanson ................... 341/143 |
| 6,587,062 B1 | * | 7/2003 | Reinhold et al. ........... 341/143 |
| 6,639,526 B1 | * | 10/2003 | Mayes ........................ 341/143 |

* cited by examiner

*Primary Examiner*—Michael Tokar
*Assistant Examiner*—Lam T. Mai
(74) *Attorney, Agent, or Firm*—Silicon Edge Law Group LLP; Darien K. Wallace

(57) ABSTRACT

An improved sigma-delta converter includes a post converter filter that receives a digital data stream. The data stream has a digital amplitude and contains quantization noise. Quantization noise is larger for digital amplitudes in a second larger-amplitude range than in a first smaller-amplitude range. The post converter filter has a higher cut-off frequency when the digital amplitude is in the first amplitude range and a lower cut-off frequency when the digital amplitude is in the second amplitude range. The post converter filter therefore filters out a portion of the larger quantization noise when the digital amplitude is larger. Quanitization noise is reduced without limiting the input signal voltage range that can be digitized.

22 Claims, 7 Drawing Sheets

NONLINEAR CONTROL BLOCK

SIGNAL ANALYSIS DEVICE

FILTER CONTROL DEVICE

VARIABLE LOW-PASS FILTER

SIGMA-DELTA ANALOG-TO-DIGITAL CONVERTER WITH REDUCED QUANTIZATION NOISE

TECHNICAL FIELD

The present invention relates to analog-to-digital converters, and more specifically to using a variable low-pass filter to reduce noise in an analog-to-digital converter.

BACKGROUND

FIG. 1 (prior art) is a simplified schematic block diagram of a conventional sigma-delta converter (SD converter) 10. SD converter 10 includes a sigma-delta modulator (SD modulator) portion 11 and a digital filter 12. SD modulator portion 11 is a first-order modulator and includes a summing amplifier 13, an integrator 14, a clocked comparator 15, and a switching device 16.

SD modulator portion 11 operates in cycles as determined by a clock signal of frequency $kf_s$ that clocks comparator 15. Summing amplifier 13 outputs an error signal 19 that represents the difference between an analog input signal 17 and a feedback signal 18. Error signal 19 represents the change in voltage of input signal 17 since the previous cycle of SD modulator portion 11. Integrator 14 performs a time domain integration of error signal 19, yielding an integrated analog output signal 20. Clocked comparator 15 compares analog output signal 20 to a fixed voltage (here, zero volts) on its inverting input lead, thereby converting analog output signal 20 into a one-bit data stream 21 having a bit rate equal to the clock rate. This one-bit data stream 21 is supplied to switching device 16. When the value of digital data stream 21 is a digital one, then switching device 16 outputs +5/4 $V_{IN}$max volts. When the value of digital data stream 21 is a digital zero, then switching device 16 outputs –5/4 $V_{IN}$max volts. Feedback signal 18 comprising a stream of +5/4 $V_{IN}$max and –5/4 $V_{IN}$max values is then fed back to the inverting input lead of summing amplifier 13. The resulting feedback loop of the circuit operates such that a running average of consecutive values of data stream 21 equals the voltage of input signal 17.

SD modulator portion 11 receives an analog input signal 17 whereas it outputs digital data values, each having a limited number of bits. Thus, some information is lost in the analog-to-digital conversion. Random "quantization noise" is therefore said to be introduced. By oversampling analog input signal 17 at a clock frequency $kf_s$ that is much higher than the frequency bandwidth of input signal 17, the quantization noise is spread over a wide frequency range. The magnitude of the quantization noise in the frequency band of interest is therefore decreased.

Integrator 14 operates further to reduce the magnitude of quantization noise in the frequency band of interest. Integrator 14 acts as a low-pass filter to the input signal 17 and as a high-pass filter to the quantization noise. The quantization noise is therefore "shaped" by integrator 14 and is pushed into higher frequencies.

The digital data stream 21 as output by SD modulator portion 11 is then filtered by digital filter 12. Filtering reduces the data rate of digital data stream 21. Filtering also removes most of the quantization noise that has been shaped into higher frequencies.

The SD converter 10 of FIG. 1 outputs a data stream of one-bit values. This example provides a simple description of the operation of a SD converter. There are, however, other SD converters that output data streams of multi-bit values.

FIG. 2 (prior art) is a graph illustrative of the output of such an SD converter that outputs a stream of three-bit values. The largest three-bit value is "111" as indicated by the top three-bit value in the column labeled "8 digital states". The smallest three-bit value is "000" as indicated by the bottom value in the column labeled "8 digital states". The stream of three-bit values that corresponds to analog input signal 17 is shown in the top row of the table below the graph.

In addition to the above-described random quantization noise introduced by interpreting a continuous analog input as a discrete digital state, non-random quantization noise is also created. This non-random noise is generated when the SD modulator portion is outputting values near the digital states that are represented by all ones (for example, "111") and all zeros (for example, "000"). Random noise results when a given analog input value is sometimes interpreted as a higher digital state and sometimes as a lower digital state. Near the digital state of all ones, however, noise cannot result in a digital state that is higher than the state with all ones. Similarly, near the digital state of all zeros, noise cannot result in a digital state that is lower than all zeros. Quantization noise near these two limits of the available digital states is not partially above and partially below the correct state and is, therefore, not random. The non-random quantization noise is not shaped into higher frequencies to the extent that random quantization noise is shaped.

One conventional method for overcoming the non-random quantization noise that occurs near the limits of the available digital states involves voltage scaling. The positive voltage value and the negative voltage value of feedback signal 18 are scaled, for example, by a factor of five fourths, so that the amplitude of error signal 19 is four fifths of its non-scaled value. Because the voltage of the feedback signal 18 can exceed the maximum voltage input voltage of input signal 17, non-random quantization noise that occurs near the limits of the available digital states can be reduced. The amplitude of analog output signal 20 is thereby reduced by four fifths, and the correct digital state of the maximum amplitude of input signal 17 is made to be a digital state less than all ones. Likewise, the correct digital state of the minimum amplitude of input signal 17 is made to be a digital state greater than all zeros.

In FIG. 2, the rightmost column labeled "6 digital states" shows the number of digital states reduced to six after scaling. After scaling, the maximum and minimum amplitudes of input signal 17 correspond to digital states 110 and 001, respectively, instead of to 111 and 000. The lower row of the table below the graph of FIG. 2 shows a series of 3-bit values of such a data stream 21 proceeding from left to right. For a description of a similar method of conventional scaling see U.S. Pat. No. 4,851,841.

Accordingly, the prior art scaling technique reduces non-random quantization noise by scaling up feedback signal amplitudes so that maximum and minimum input signal voltages are represented digitally by states that are not the maximum and minimum available digital states. Because quantization noise is increased by decreasing the number of digital states, this scaling technique increases random quantization noise. Moreover, scaling up the amplitude of feedback signal 18 increases power consumption.

An apparatus and a method are sought that decrease quantization noise in the frequency band of interest while using all available digital states.

SUMMARY

A sigma-delta converter includes a sigma-delta converter portion and a post converter filter portion. The post converter filter portion receives a digital data stream from the sigma-delta converter portion. The digital data stream comprises a signal of interest having a digital amplitude and contains quantization noise. The quantization noise is larger when the digital amplitude is in a second range of larger amplitude than when the digital amplitude is in a first range of smaller amplitude. In accordance with one embodiment, the post converter filter portion has a first cut-off frequency when the digital amplitude is in the first amplitude range and a second cut-off frequency when the digital amplitude is in the second amplitude range. Where the sigma-delta converter portion includes a digital low-pass filter with a fixed cut-off frequency, the first cut-off frequency of the post converter filter portion is higher than the fixed cut-off frequency, whereas the second cut-off frequency of the post converter filter portion is lower than the fixed cut-off frequency. Accordingly, when the digital amplitude is in the first amplitude range corresponding to a smaller quantization noise, the post convert portion has a higher cutoff-frequency than the digital low-pass filter and therefore has minimal effect. When the digital amplitude is in the second amplitude range corresponding to a larger quantization noise, on the other hand, the post converter filter portion has a lower cutoff-frequency than the digital low-pass filter and therefore filters out a portion of the larger quantization noise. This filtering out of quanitization noise is accomplished without having to reduce the number of digital states used to represent the magnitude of the input signal. In one embodiment, power consumption of the sigma-delta converter is minimized by not scaling up the voltage amplitude of a feedback signal.

In another embodiment, the variable low-pass filter is switched off when the amplitude of the digital data stream is in the first amplitude range corresponding to smaller quantization noise.

In accordance with a specific embodiment, a signal analysis device of the post converter filter portion detects the digital amplitude of the digital data stream and outputs a filter control value based on the detected value. This filter control value, which is supplied to a variable low-pass filter of the post converter filter portion, controls the variable low-pass filter to have the appropriate one of the first and second cut-off frequencies. The first cut-off frequency can be higher than the fixed cut-off frequency of the digital low-pass filter, such that the post converter filter portion does not have a significant impact on the resulting output of the analog-to-digital converter. The second cut-off frequency, however, is lower than the fixed cut-off frequency of the digital low-pass filter, such that the post converter filter portion operates to remove significant quantization noise from the output of the sigma-delta converter portion.

In situations where a sigma-delta converter is battery powered and $V_{IN}$max is the battery voltage, the maximum input signal amplitude that can be digitized using the conventional voltage scaling technique is smaller than $V_{IN}$max by a scaling factor. In accordance with one embodiment of the present invention, on the other hand, the maximum input signal amplitude that can be digitized is approximately $V_{IN}$max. In a case where the sigma-delta converter is battery powered, input signals of amplitude up to the battery voltage can be digitized.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
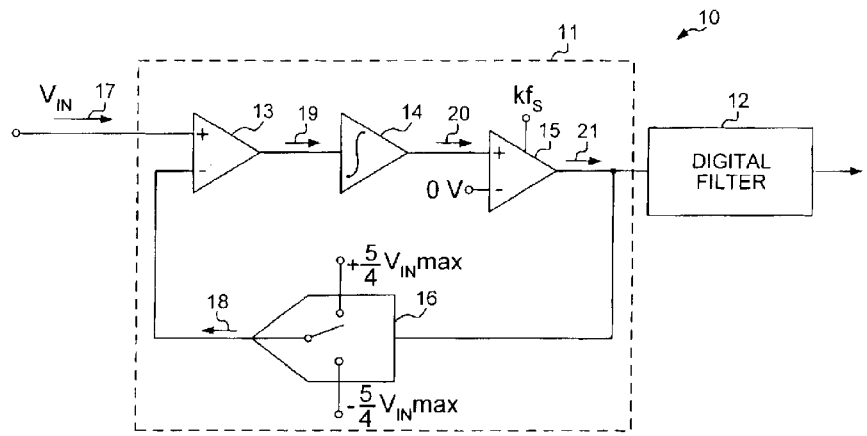
FIG. 1 (prior art) is a simplified schematic block diagram of a sigma-delta converter of the prior art.
Figure 2:
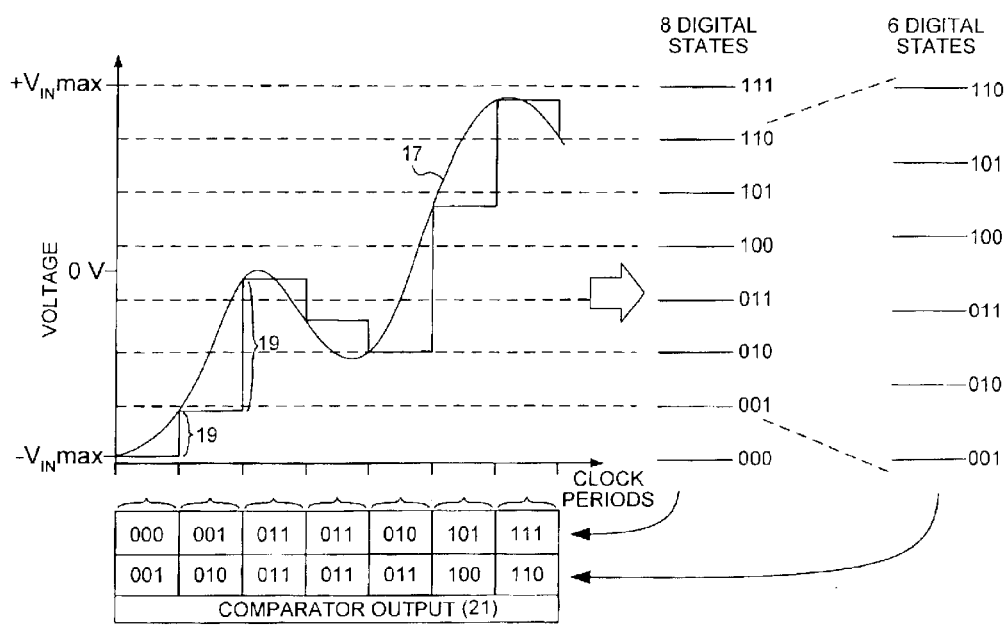
FIG. 2 (prior art) is a graph illustrating a voltage scaling method of the prior art.
Figure 3:
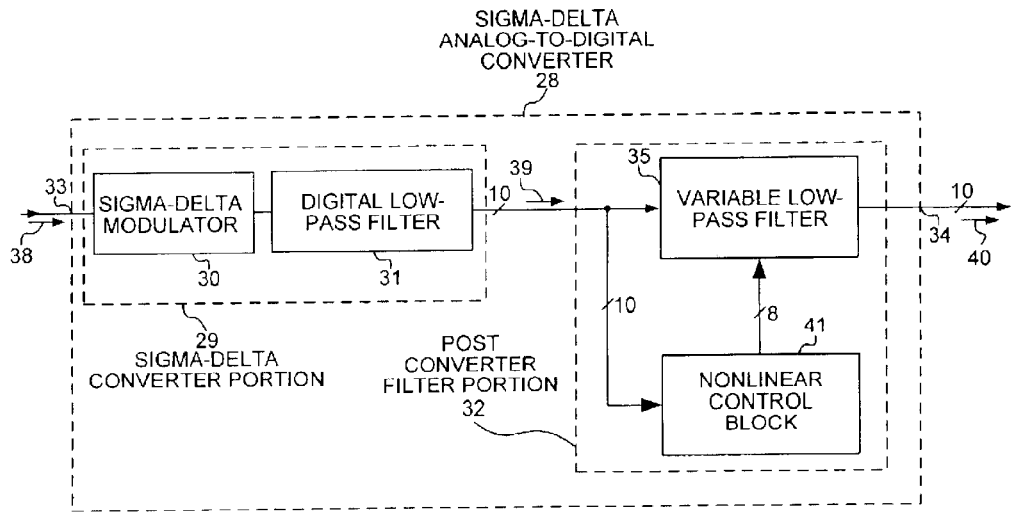
FIG. 3 is a simplified schematic block diagram of an improved sigma-delta converter with a variable low-pass filter.

FIG. 3 is a simplified schematic block diagram of a sigma-delta analog-to-digital converter (SDADC) 28 in accordance with one embodiment of the present invention. SDADC 28 includes a sigma-delta converter portion 29 and a post converter filter portion 32. Sigma-delta converter portion 29 includes a sigma-delta modulator (SD modulator) 30 and a digital low-pass filter 31. SDADC 28 has an input lead 33 and a ten-bit output bus 34. Post converter filter portion 32 includes a variable low-pass filter 35 and a nonlinear control block 41.

SDADC 28 receives a continuous analog input signal 38 on input lead 33. SDADC 28 outputs a stream of ten-bit digital output values 40 onto ten-bit output bus 34. In this embodiment, SD modulator 30 and digital low-pass filter 31 convert analog input signal 38 to a ten-bit intermediary digital data stream 39. Intermediary digital data stream 39 uses all of the 1024 ($2^{10}$) digital states available for the ten-bit output of digital low-pass filter 31.

SD modulator 30 introduces random quantization noise into intermediary digital data stream 39 as SD modulator 30 digitizes continuous analog input signal 38 into the available 1024 digital states. The amount of random quantization noise expressed as power depends on the step size of the digital states used for digitization.

SD modulator 30 oversamples analog input signal 38 at a sampling frequency $kf_s$ (where k is the oversampling ratio) that is at least twice as great as the frequency of analog input signal 38 in order to avoid aliasing according to the Nyquist theory. Oversampling spreads the quantization noise power over a wide frequency range that is proportional to k. The power level of the random quantization noise is thereby decreased at each frequency of intermediary data stream 39, including at the frequency band of input signal 38. SD modulator 30 also shapes the random quantization noise into higher frequencies and decreases the magnitude of quantization noise at the frequency band of input signal 38.

SD modulator 30 also creates non-random quantization noise during digitization when the voltage amplitude of analog input signal 38 is converted to a high digital amplitude represented by a digital state of all ones (for example, "1111111111"). In addition, non-random quantization noise is also created during digitization when the voltage amplitude of input signal 38 is converted to a low digital amplitude represented by a digital state of all zeros (for example, "0000000000"). Near the digital amplitudes of all ones and all zeros, quantization noise is not represented over time as being both above and below the correct digital amplitude because digital states higher than all ones and lower than all zeros are not available. Thus, quantization noise near the limits of the available digital states is not random and is not shaped into higher frequencies by SD modulator 30 to the same extent as random noise is shaped.

Figure 4:
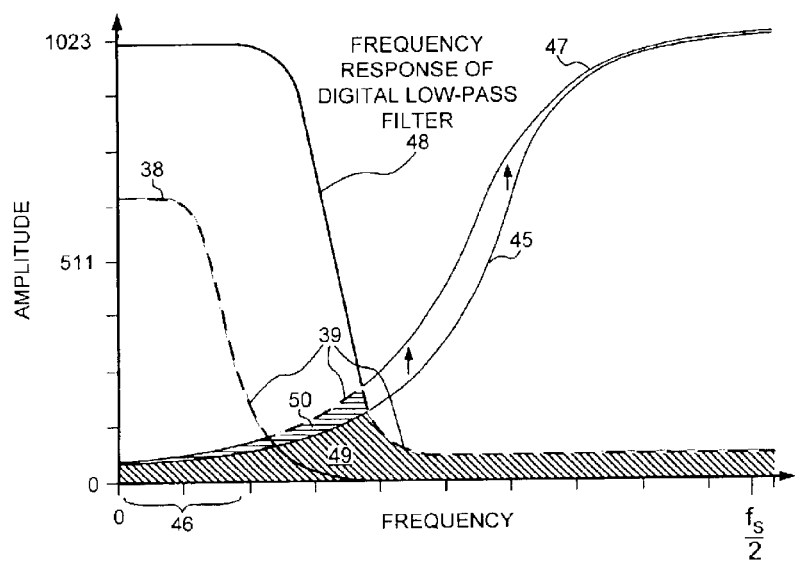
FIG. 4 is a graph of a frequency response curve of the sigma-delta converter portion of the improved sigma-delta converter.

FIG. 4 shows how SD modulator 30 shapes the random quantization noise towards higher frequencies. Frequency response curve 48 represents the response curve of digital low-pass filter 31. In this embodiment, frequency response curve 48 is a fixed frequency response curve. Digital low-pass filter 31 filters out both random and non-random quantization noise that exist above first frequency response curve 48. The resulting filtered ten-bit intermediary digital data stream 39 is supplied to variable low-pass filter 35, as well as to nonlinear control block 41.

The dashed line in FIG. 4 illustrates the frequency domain waveform of intermediary digital data stream 39. The scale of the amplitude of noise and of data stream 39 is shown as the 1024 digital states (zero through 1023) of ten-bit resolution into which the voltage of data stream 39 and noise has been quantized. The area below curve 45 represents random quantization noise that has been shaped into frequencies higher than the frequency band 46 of analog input signal 38. Curve 45 has a region of increasing slope at lower frequencies and a region of decreasing slope at higher frequencies. Curve 45 corresponds to the shaping achieved by SD modulator 30, which is a higher-order SD modulator with multiple feedback loops and integrators. In another embodiment having a first-order sigma-delta modulator with a single feedback loop and a single integrator, the curve representing shaped quantization noise may have only a region of decreasing slope.

In FIG. 4, the area between curve 47 and curve 45 represents the non-random quantization noise created by SD modulator 30. This non-random quantization noise is shaped to a much lesser extent into higher frequencies than is random quantization noise and contributes a substantial additional amount of noise at all frequencies.

First frequency response curve 48 represents a frequency domain transfer function of digital low-pass filter 31. Digital low-pass filter 31 therefore filters outs both random and non-random quantization noise that exist above first frequency response curve 48. As shown in FIG. 4, an amount 49 of random quantization noise and an amount 50 of non-random quantization noise pass through digital low-pass filter 31.

The amount 50 of non-random quantization noise does not pass through the digital filter 12 of the prior art described in the background section because that prior art reduces non-random quantization noise through voltage scaling. In this embodiment of the present invention, however, post converter filter portion 32 filters out a portion of the amount 50 of non-random quantization noise.

Figure 5:
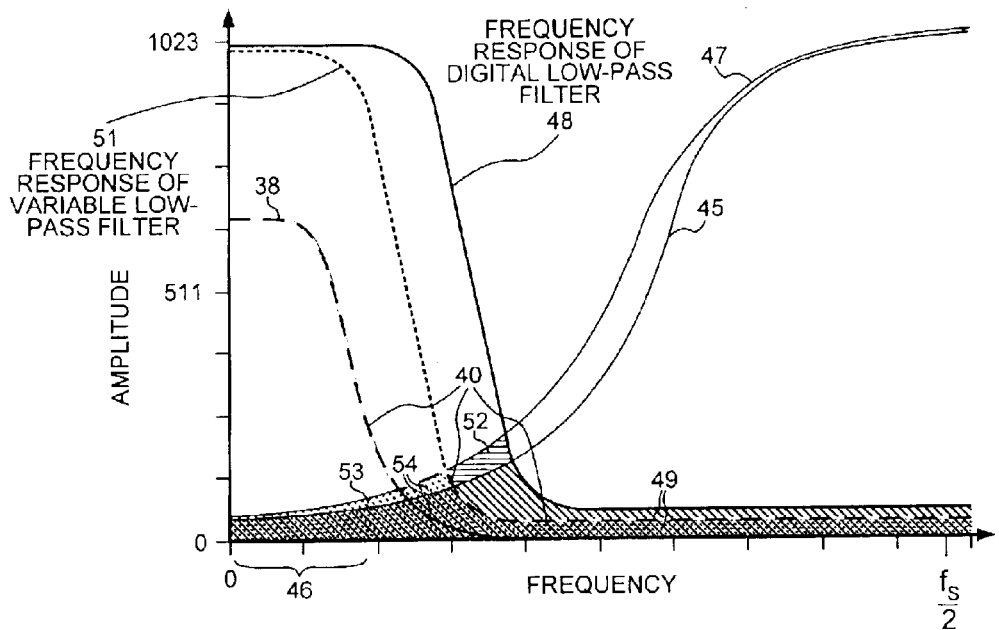
FIG. 5 is a graph showing a frequency response curve of the post converter filter portion of the improved sigma-delta converter.

FIG. 5 illustrates how a portion of amount 50 of non-random quantization noise is filtered out in this embodiment. Variable low-pass filter 35 can have any one of a plurality of frequency domain transfer functions as determined by an eight-bit filter control value supplied to it by nonlinear control block 41. In FIG. 5, second frequency response curve 51 represents the multiple transfer functions of variable low-pass filter 35 for multiple filter control values. By varying the filter control value supplied to variable low-pass filter 35, second frequency response curve 51 can be set to have a cut-off frequency either higher or lower than the cut-off frequency $f_c48$ of first frequency response curve 48. When the cut-off frequency of second frequency response curve 51 is lower than the cut-off frequency $f_c48$ of first frequency response curve 48, variable low-pass filter 35 filters out a portion 52 (see FIG. 5) of the amount 50 (see FIG. 4) of non-random quantization noise. As shown in FIG. 5, a portion 53 of the amount 50 of non-random quantization noise passes through variable low-pass filter 35. The sum of random and non-random quantization noise that passes through variable low-pass filter 35 is shown in FIG. 5 as dashed-shaded area 54. The frequency domain waveform of the digital output 40 of SDADC 28 is shown as a dashed line.

Figure 6:
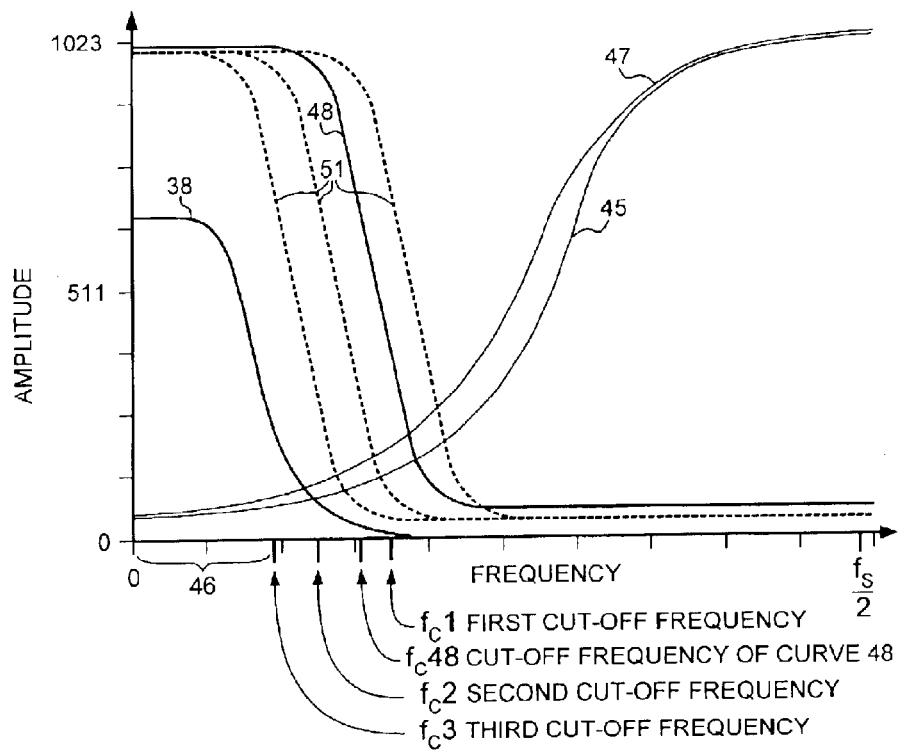
FIG. 6 is a graph of the frequency response curve of FIG. 5 showing three variable cut-off frequencies.

FIG. 6 shows three frequency domain transfer functions of second frequency response curve 51. A first frequency domain transfer function has a first cut-off frequency $f_c1$ that is higher than the cut-off frequency $f_c48$ of first frequency response curve 48. A second frequency domain transfer function has a second cut-off frequency $f_c2$ that is lower than the cut-off frequency $f_c48$ of first frequency response curve 48. A third frequency domain transfer function has a third cut-off frequency $f_c3$ that is lower than second cut-off frequency $f_c2$, but higher than frequency band 46 of analog input signal 38.

Figure 7:
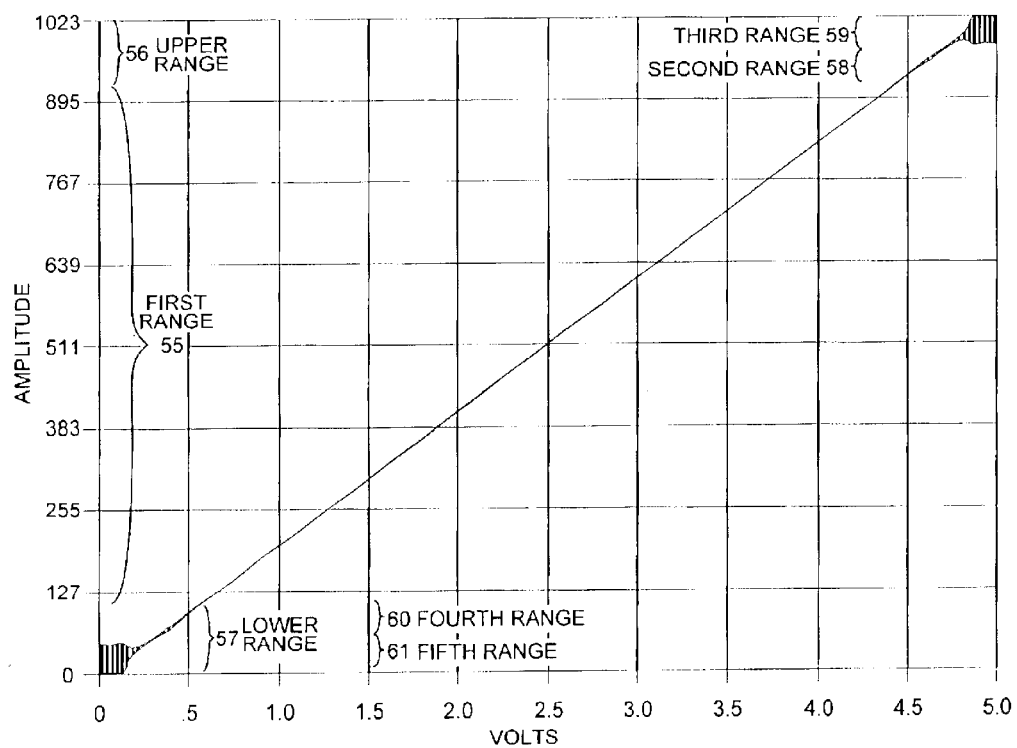
FIG. 7 is a graph of analog input voltage versus digital amplitude of a converted digital data stream.

FIG. 7 is a graph showing the correlation between voltage amplitudes of analog input signal 38 on the horizontal axis and the corresponding digital amplitude of the filtered and decimated ten-bit intermediary digital data stream 39 on the vertical axis. As shown on the horizontal axis, SDADC 28 digitizes input signal 38 having an amplitude ranging from zero volts to five volts. SD modulator 30 and digital low-pass filter 31 convert analog input signal 38 to digital data stream 39 with little noise when the converted digital amplitude is in a first range 55 of medium amplitude.

In an upper range 56 of high amplitude, however, where voltage amplitudes of input signal 38 are digitized into digital amplitudes near the digital state of all ones (for example, "1111111111"), SD modulator 30 creates non-random quantization noise. FIG. 7 shows the noise envelope of numerous digital amplitudes in upper range 56 between the digital values 1008 and 1024 into which discrete analog voltages are potentially digitized. There is likewise a noise envelope of numerous digital amplitudes in a lower range 57 of low amplitude between the digital values zero and sixteen into which discrete analog voltages are potentially digitized. FIG. 7 illustrates that the saturation of digital states near all ones ("1111111111" representing 1023) and near all zeros ("0000000000") results in non-random quantization noise that is not satisfactorily shaped into higher frequencies and filtered out by digital low-pass filter 31.

Figure 8:
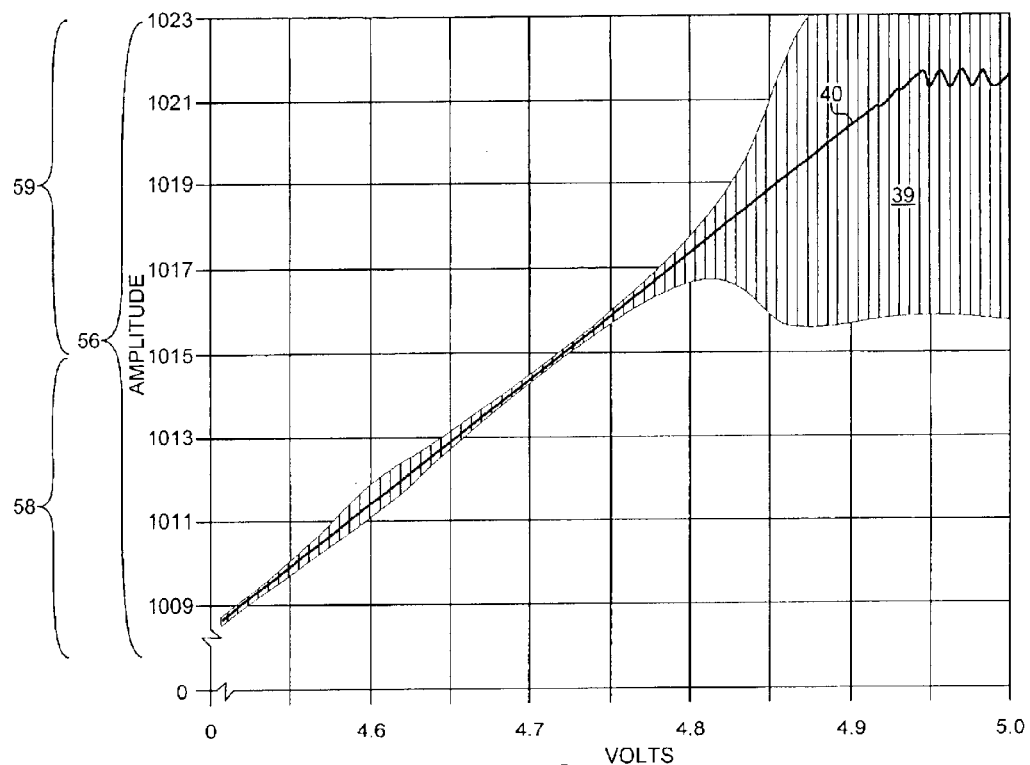
FIG. 8 is a larger scale graph of input voltage versus digital amplitude of a portion of the graph of FIG. 7.

FIG. 8 shows the high-amplitude upper range 56 of FIG. 7 in more detail. Upper range 56 of high digital amplitude itself is composed of a second range 58 and a third range 59. Non-random quantization noise from saturation of digital states is more pronounced in third range 59 between digital values of 1016 and 1023 than in second range 58 between digital values of 1008 and 1016. A voltage amplitude of analog input signal 38 equaling 4.85 volts, for example, is potentially converted to numerous digital amplitudes of digital data stream 39 equaling anywhere between 1016 and 1021.

FIG. 8 also shows the correlation between voltage amplitudes of analog input signal 38 and the corresponding digital amplitude of digital output 40 of SDADC 28 in accordance with an embodiment of the present invention. The non-random quantization noise associated with the saturation of digital states is substantially removed from digital output 40. The additional attenuation of non-random quantization noise is accomplished by post converter filter portion 32. Post converter filter portion 32 filters out the additional portion 52 (shown in FIG. 4) of non-random quantization noise by reducing the cut-off frequency of second frequency response curve 51 from pre-set first cut-off frequency $f_c 1$ to second cut-off frequency $f_c 2$ when the digital amplitude of digital output 40 enters upper range 56 of high digital amplitude and lower range 57 of low digital amplitude.

Figure 9:
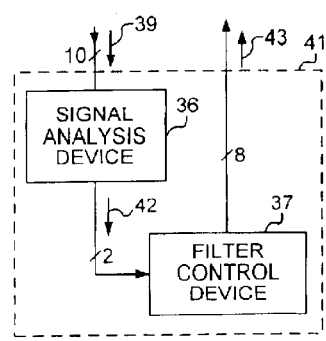
FIG. 9 is a simplified schematic block diagram of a nonlinear control block.

FIG. 9 is a simplified block diagram of one specific embodiment of nonlinear control block 41. Nonlinear control block 41 includes a signal analysis device 36, and a filter control device 37. Digital data stream 39 is supplied to signal analysis device 36. Signal analysis device 36 senses the digital amplitude of data stream 39, which is proportional to the voltage amplitude of analog input signal 38. Signal analysis device 36 outputs a two-bit signal analysis code indicative of whether the digital amplitude is: in first range 55 ("00"), in second range 58 or fourth range 60 ("01") in third range 59 or fifth range 61 ("11").

Figure 10:
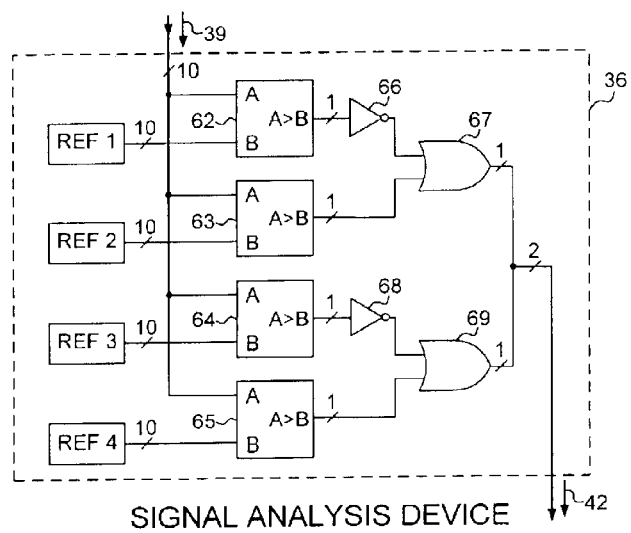
FIG. 10 is a simplified schematic block diagram of a signal analysis device.

FIG. 10 is a simplified schematic block diagram of one specific example of signal analysis device 36. Signal analysis device 36 senses the digital amplitude of ten-bit intermediary digital data stream 39 by comparing the value of the ten-bit data stream to four ten-bit reference values. The values are compared using four comparators 62–65.

Comparator 62 compares the value of ten-bit data stream 39 to a first reference value, in this embodiment a ten-bit value equaling eight. When the value of data stream 39 is greater than the digital value eight, comparator 62 outputs a one-bit digital one, which is then inverted to zero by inverter 66. Comparator 63 compares the value of data stream 39 to a second reference value, a ten-bit value equaling one thousand sixteen. When the value of data stream 39 is greater than the digital value one thousand sixteen, comparator 63 outputs a digital one. The output of converter 66 and comparator 63 are then ORed by OR gate 67. OR gate 67 outputs a one-bit digital one whenever the digital amplitude of ten-bit data stream 39 is greater than the digital value one thousand sixteen or below eight. As shown in FIGS. 7 and 8, the amplitudes of data stream 39 above the digital value one thousand sixteen and below the digital value eight correspond to voltage ranges exhibiting the greatest non-random quantization noise. As shown in FIG. 8, digital amplitudes of data stream 39 that are greater than the digital value one thousand sixteen fall within third range 59.

Returning to FIG. 10, the amplitude of data stream 39 is likewise compared by comparator 64 with a third reference value equaling sixteen, and by comparator 65 with a fourth reference value equaling one thousand eight. The output of comparator 64 is inverted by inverter 68, whose output is ORed by OR gate 69 with the output of comparator 65. OR gate 69 outputs a one-bit digital one whenever the amplitude of data stream 39 falls within either lower range 57 or upper range 59.

The one-bit outputs of OR gate 67 and OR gate 69 together constitute a two-bit signal analysis code 42, which is output by signal analysis device 36. When both bits of signal analysis code 42 are digital ones, the digital amplitude of data stream 39 falls within amplitude third ranges 59 or fifth range 61 that exhibit the greatest non-random quantization noise. When only one of the bits of signal analysis code 42 is a digital one, the digital amplitude of data stream 39 falls within second range 58 or fourth range 60. When the two-bit signal analysis code 42 is "00", the digital amplitude of data stream 39 falls within the first range 55 in which quantization noise is the smallest. As shown in FIG. 9, the two-bit signal analysis code 42 is supplied to filter control device 37 through a 2-bit bus.

Figure 11:
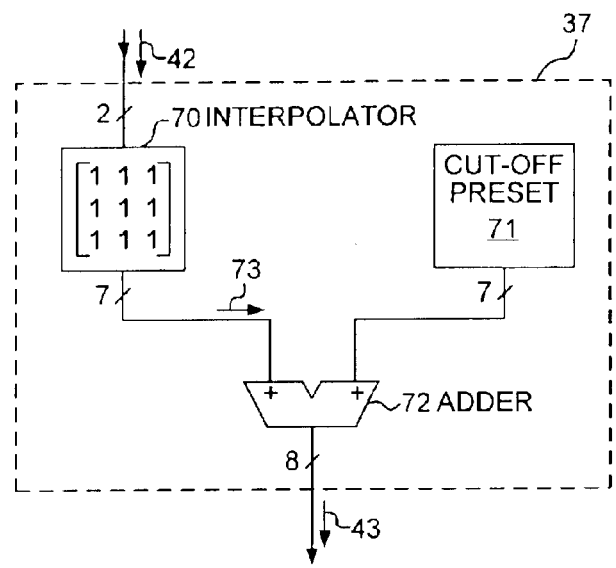
FIG. 11 is a simplified schematic block diagram of a filter control device.

FIG. 11 is a simplified schematic block diagram of one specific example of filter control device 37. Filter control device 37 includes an interpolator 70, a cut-off preset register 71 and an adder 72. Interpolator 70 adds five bits to the two-bit signal analysis code 42 and outputs the resulting seven-bit signal as an interpolated signal analysis code 73. In this embodiment, immediately following a change in the value of signal analysis code 42, the five added bits are incremented or decremented over time in a pre-defined, non-linear manner so that the rate of change of the value of seven-bit interpolated signal analysis code 73 is at first slower, then speeds up, and then slows. This interpolated change in the value of the seven-bit code 73 smoothes the change from the control value for one sensed digital amplitude to the next sensed digital amplitude.

Interpolated signal analysis code 73 is added by adder 72 to a pre-set code corresponding to the pre-set first cut-off frequency $f_c 1$ of second frequency response curve 51 of variable low-pass filter 35. The pre-set code is stored in the cut-off preset register 71. The cut-off frequency of second frequency response curve 51 varies from the pre-set cut-off frequency $f_c 1$ based on the value of the interpolated signal analysis code 73. Adder 72 outputs the 8-bit filter control value 43.

Figure 12:
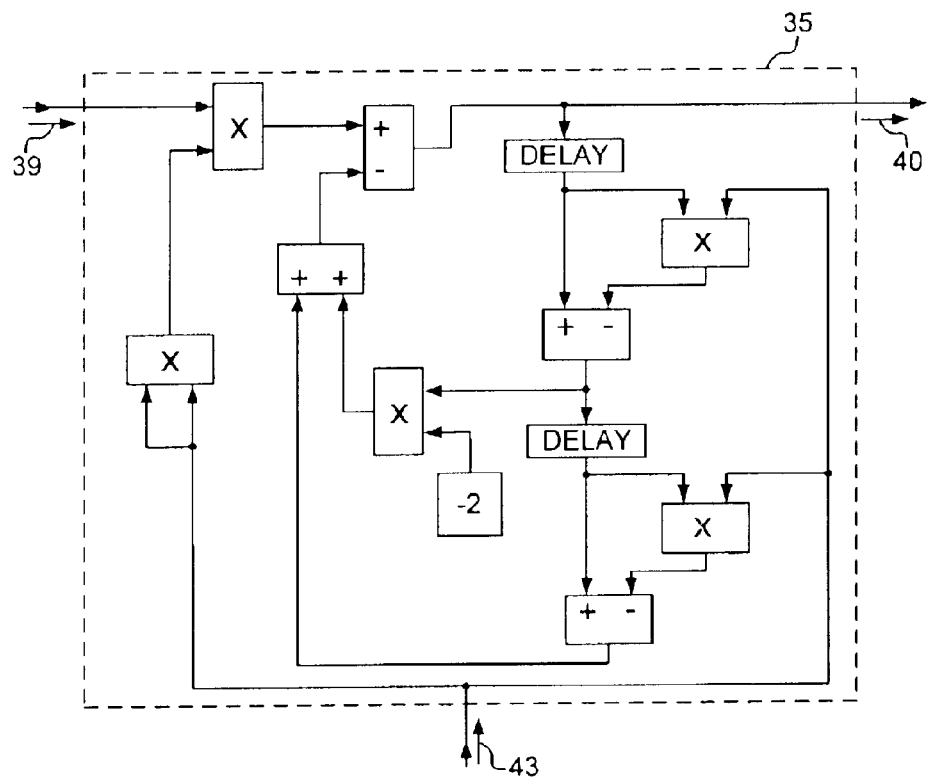
FIG. 12 is a simplified schematic block diagram of a variable low-pass filter.

FIG. 12 is a simplified schematic block diagram of variable low-pass filter 35. In this embodiment, variable low-pass filter 35 is an infinite impulse response (IIR) digital filter. In addition to receiving digital data stream 39, variable low-pass filter 35 also receives the 8-bit filter control value 43 from nonlinear control block 41. Each different filter control value 43 configures the variable low-pass filter 35 to have an associated different cut-off frequency. Filter gain, however, remains substantially constant regardless of which filter control value is being used. In this embodiment, the gain in the pass band of variable low-pass filter 35 remains near unity for all cut-off frequencies. For additional information on configurable infinite impulse response filters, such as variable low-pass filter 35 in accordance with this embodiment, see U.S. Pat. No. 6,009,445, by Anatoliy V. Tsyrganovich, issued Dec. 28, 1999 (the entirety of which is hereby incorporated by reference).

Figure 13:
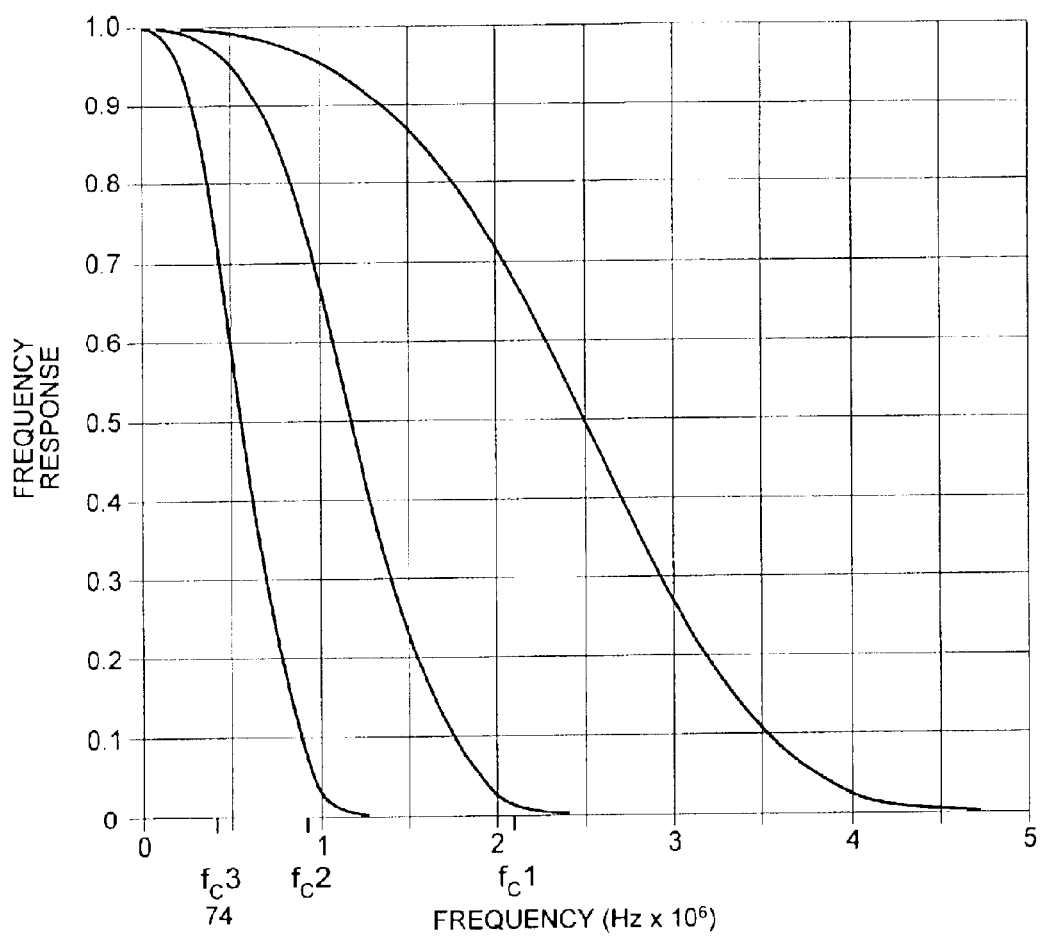
FIG. 13 is a graph of the frequency response curve of FIG. 6 in a larger scale.

FIG. 13 shows second frequency response curve 51 of variable low-pass filter 35 for three different values of filter control value 43. In one possible configuration, second frequency response curve 51 has third cut-off frequency $f_c 3$ (74) when filter control value 43 corresponds to a signal analysis code 42 of two digital ones ("11"). In this configuration, the cut-off frequency of second frequency response curve 51 is lowest when the digital amplitude of data stream 39 falls within an amplitude range that exhibits the greatest non-random quantization noise, such as third range 59 or fifth range 61. When configured with third cut-off frequency $f_c3$ (74), variable low-pass filter 35 filters out significant non-random quantization noise that has passed through digital low-pass filter 31. The resulting reduction in non-random quantization noise is evident in FIG. 8 by comparing the low noise of digital output 40 to the large noise envelope of digital data stream 39.

Although the present invention has been described in connection with certain specific embodiments for instructional purposes, the present invention is not limited thereto. Modulators having different noise shaping characteristics can be used. In some cases, noise is shaped both to higher and lower frequencies that the frequency band of interest. In such cases, both the filter of the sigma-delta converter portion, as well as the filter of the post converter filter portion are band-pass filters. In one specific embodiment, for example, second frequency response curve 51 resembles the transfer function of a band-pass filter rather than a low-pass filter. In that embodiment, variable low-pass filter 35 is replaced with a variable band-pass filter. The lower tail portions of the band-pass filter realized by the variable band-pass filter are used to filter out non-random quantization noise that has a frequency lower than the frequency band 46 of analog input signal 38.

In yet another embodiment, variable low-pass filter 35 is a finite impulse response (FIR) digital filter rather than an infinite impulse response (IIR) digital filter. In yet another embodiment, digital low-pass filter 31 includes a decimation circuit that reduces the data rate of digitized input signal 38, which is output by sigma-delta modulator 30. Although the amplitude of the digital data stream is described as representing the voltage of an input signal, the amplitude in other embodiments can represent the current of an input current signal. The post converter filter portion can be controlled to vary filter attributes other than the cutoff frequency. For example, the post converter filter portion can be controlled to change the attenuation in the stop band of the filter. In yet another embodiment, variable low-pass filter 35 is switched off when the amplitude of the digital data stream is in the first range of smaller amplitude corresponding to a smaller quantization noise.

Accordingly, various modifications, adaptations, and combinations of various features of the described embodiments can be practiced without departing from the scope of the invention as set forth in the claims.

What is claimed is:

1. A circuit comprising:
    a sigma-delta converter portion that outputs a digital data stream; and
    a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range.

2. The circuit of claim 1, wherein the digital data stream exhibits greater quantization noise in the second amplitude range than in the first amplitude range.

3. The circuit of claim 1, wherein the post converter filter portion passes substantially all frequency components of the digital data stream when the amplitude of the digital data stream is in the first amplitude range.

4. The circuit of claim 1, wherein the circuit is an integrated circuit.

5. A circuit comprising:
    a sigma-delta converter portion that outputs a digital data stream; and
    a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the sigma-delta converter portion has a digital low-pass filter having a fixed cut-off frequency, wherein the first cut-off frequency is higher than the fixed cut-off frequency, and wherein the second cut-off frequency is lower than the fixed cut-off frequency.

6. A circuit comprising:
    a sigma-delta converter portion that outputs a digital data stream; and
    a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the post converter filter portion has a third cut-off frequency when the amplitude of the digital data stream is in a third amplitude range, the digital data stream exhibiting greater quantization noise in the third amplitude range than in the second amplitude range.

7. A circuit comprising:
    a sigma-delta converter portion that outputs a digital data stream; and
    a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the post converter filter portion can also have a third cut-off frequency, and wherein which one of the first, second and third cut-off frequencies the post converter filter portion has is determined at least in part based on the amplitude of the digital data stream.

8. A circuit comprising:
    a sigma-delta converter portion that outputs a digital data stream; and
    a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the post converter filter portion includes a variable low-pass filter, the variable low-pass filter being controlled by a digital filter control value, the digital filter control value being determined at least in part based on the amplitude of the digital data stream.

9. A circuit comprising:
    a sigma-delta converter portion that outputs a digital data stream; and
    a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the digital data stream is a series of multi-bit digital values, and the amplitude at a given point in time is one of the multi-bit digital values.

10. A circuit comprising:
a sigma-delta converter portion that outputs a digital data stream; and
a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the sigma-delta converter portion comprises a sigma-delta modulator and a digital low-pass filter.

11. A circuit comprising:
a sigma-delta converter portion that outputs a digital data stream; and
a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the post converter filter portion comprises a variable low-pass filter, and wherein the variable low-pass filter is an infinite impulse response digital filter.

12. A circuit comprising:
a sigma-delta converter portion that outputs a digital data stream; and
a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the digital data stream is a series of multi-bit digital values, each multi-bit digital value having N bits, and wherein there are $2^N$ different digital values in the series of multi-bit digital values.

13. The circuit of claim 12, wherein the circuit digitizes an input signal throughout a voltage range of the input signal, the voltage range having a first magnitude, and wherein the circuit is powered by a voltage of a second magnitude, the first magnitude being substantially identical to the second magnitude.

14. A circuit comprising:
a sigma-delta converter portion that outputs a digital data stream; and
a post converter filter portion that receives the digital data stream, the post converter filter portion having a first cut-off frequency when an amplitude of the digital data stream is in a first amplitude range, the post converter filter portion having a second cut-off frequency when the amplitude of the digital data stream is in a second amplitude range, wherein the post converter filter portion has a frequency response curve having a pass band portion and a stop band portion, and wherein the post converter filter portion is controlled to change an attenuation in the stop band portion.

15. A method, comprising:
receiving a digital data stream from a sigma-delta converter portion, the digital data stream containing quantization noise;
determining a filter control value;
setting a cut-off frequency of a variable filter of a post converter filter portion based on the filter control value; and
passing the digital data stream through the variable filter such that the post converter portion filters out a portion of the quantization noise.

16. The method of claim 15, wherein the sigma-delta converter portion and the post converter filter portion together comprise a sigma-delta analog-to-digital converter.

17. A method, comprising:
receiving a digital data stream from a sigma-delta converter portion, the digital data stream containing quantization noise;
determining a filter control value, wherein the determining a filter control value comprises (i) sensing a digital amplitude of the digital data stream and (ii) comparing the digital amplitude to a limit of an amplitude range, wherein the filter control value is determined based on a comparison of the digital amplitude and the limit of the amplitude range;
setting a cut-off frequency of a variable filter of a post converter filter portion based on the filter control value; and
passing the digital data stream through the variable filter such that the post converter portion filters out a portion of the quantization noise.

18. A method, comprising:
receiving a digital data stream from a sigma-delta converter portion, the digital data stream containing quantization noise;
determining a filter control value;
setting a cut-off frequency of a variable filter of a post converter filter portion based on the filter control value, wherein the variable filter has a first cut-off frequency when a digital amplitude of the digital data stream is in a first range, and wherein the variable filter has a second cut-off frequency when the digital amplitude is in a second range, the digital data stream exhibiting a larger quantization noise when the digital amplitude is within the second range than when the digital amplitude is within the first range; and
passing the digital data stream through the variable filter such that the post converter portion filters out a portion of the quantization noise.

19. A method, comprising:
receiving a digital data stream from a sigma-delta converter portion, the digital data stream containing quantization noise;
determining a filter control value;
setting a cut-off frequency of a variable filter of a post converter filter portion based on the filter control value, wherein the variable filter is an infinite impulse response digital filter; and
passing the digital data stream through the variable filter such that the post converter portion filters out a portion of the quantization noise.

20. A sigma-delta analog-to-digital converter that outputs an output digital data stream, comprising:
a sigma-delta converter portion that outputs an intermediary digital data stream, the intermediary digital data stream being a stream of multi-bit digital values, each of the multi-bit digital values having N bits, the intermediary digital data stream having quantization noise; and means for receiving the intermediary digital data stream and for outputting the output digital data stream such that the output digital data stream has less quantization noise than the intermediary digital data stream, and wherein the output digital data stream is a stream of multi-bit digital values, each of the multi-bit digital values of the output digital data stream having N bits, and wherein each of the intermediary and the output digital data streams has $2^N$ different digital values.

21. A sigma-delta analog-to-digital converter that outputs an output digital data stream, comprising:

a sigma-delta converter portion that outputs an intermediary digital data stream, the intermediary digital data stream being a stream of multi-bit digital values, each of the multi-bit digital values having N bits, the intermediary digital data stream having quantization noise; and means for receiving the intermediary digital data stream and for outputting the output digital data stream such that the output digital data stream has less quantization noise than the intermediary digital data stream, wherein the output digital data stream is a stream of multi-bit digital values, each of the multi-bit digital values of the output digital data stream having N bits, wherein each of the intermediary and the output digital data streams has 2N different digital values, and wherein the means comprises (i) means for sensing a digital amplitude of the intermediary digital data stream and for outputting a filter control value and (ii) a variable filter that receives the filter control value from the means for sensing.

22. A sigma-delta analog-to-digital converter that outputs an output digital data stream, comprising:

a sigma-delta converter portion that outputs an intermediary digital data stream, the intermediary digital data stream being a stream of multi-bit digital values, each of the multi-bit digital values having N bits, the intermediary digital data stream having quantization noise; and means for receiving the intermediary digital data stream and for outputting the output digital data stream such that the output digital data stream has less quantization noise than the intermediary digital data stream, wherein the output digital data stream is a stream of multi-bit digital values, each of the multi-bit digital values of the output digital data stream having N bits, wherein each of the intermediary and the output digital data streams has 2N different digital values, and wherein the means filters the intermediary digital data stream with a variable filter, the variable filter having a first cut-off frequency when a digital amplitude of the intermediary digital data stream is within a first range, the variable filter having a second cut-off frequency when a digital amplitude of the intermediary digital data stream is within a second range.

* * * * *